United States Patent [19]

Buttle

[11] Patent Number: 5,157,690
[45] Date of Patent: Oct. 20, 1992

[54] ADAPTIVE CONVERGENT DECISION FEEDBACK EQUALIZER

[75] Inventor: Kenneth G. Buttle, Orangevale, Calif.

[73] Assignee: Level One Communications, Inc., Folsom, Calif.

[21] Appl. No.: 605,735

[22] Filed: Oct. 30, 1990

[51] Int. Cl.$^5$ .......................... H03H 7/30; H03H 7/40
[52] U.S. Cl. ................................... 375/14; 375/101; 370/32.1; 333/18; 379/410
[58] Field of Search .......................... 375/12, 14, 101; 333/28 R, 18; 370/32.1; 379/410

[56] References Cited

U.S. PATENT DOCUMENTS

| | | | |
|---|---|---|---|
| 3,792,356 | 2/1974 | Kobayashi et al. | 375/14 |
| 4,170,758 | 10/1979 | Tamburelli | 375/12 |
| 4,270,179 | 5/1981 | Sifford et al. | 364/724 |
| 4,283,788 | 8/1981 | Tamburelli | 375/14 |
| 4,412,341 | 10/1983 | Gersho et al. | 375/102 |
| 4,468,786 | 8/1984 | Davis | 375/11 |
| 4,494,242 | 1/1985 | Ehrenbard et al. | 375/118 |
| 4,520,489 | 5/1985 | Hogge Jr. | 375/14 |
| 4,583,234 | 4/1986 | Ramadan | 375/11 |
| 4,700,359 | 10/1987 | Loscher | 375/20 |
| 4,730,343 | 5/1988 | Kanemasa et al. | 375/14 |
| 4,760,596 | 7/1988 | Agrawal et al. | 370/32.1 |
| 4,789,994 | 12/1988 | Randall et al. | 375/12 |
| 4,896,334 | 1/1990 | Sayar | 375/20 |
| 5,020,078 | 5/1991 | Crespo | 375/12 |
| 5,029,167 | 7/1991 | Arnon et al. | 375/14 |

OTHER PUBLICATIONS

IEEE Journal on Selected Areas in Communications, Mar. 1984 vol. SAC-2, No. 2, pp.314-323, Piet J. Van Gerwen, "Design Considerations for a 144 kbit/s Digital Transmission Unit for the Local Telephone Network".

Primary Examiner—Benedict V. Safourek
Assistant Examiner—Young T. Tse
Attorney, Agent, or Firm—Merchant, Gould, Smith, Edell, Welter & Schmidt

[57] ABSTRACT

An adaptive convergent decision feedback equalizer apparatus and method is disclosed for reducing intersymbol interference (ISI) in a data communication system. ISI is cancelled by generating and subtracting an estimation of the interference from a received signal. the estimation is generated by a N-tap transversal filter in which individual delayed received signals stored in the taps are multiplied by the respective adaptable tap coefficient and summed to form a digital representation of the ISI present. The present invention takes two steps to reduce the probability of coefficient adaptation from diverging. First, the DFE performs a coefficient modification only when the delayed received signal is a particular filter tap is a maximum or minimum level of the selected line code. A second step to eliminate divergence addresses the start up coefficient determination and errors in ISI estimation as the filter coefficients grow in size. On start up, only the first P number of DFE taps are chosen for modification and the remaining taps are held at zero. P is a number of taps for which the sum of the uncancelled ISI and the voltage error of an incorrect ISI estimation yields less than 0.5 probability of an error. After a minimum time ($t_{min}$) which insures convergence, the remaining taps (N-P) are enabled.

19 Claims, 5 Drawing Sheets

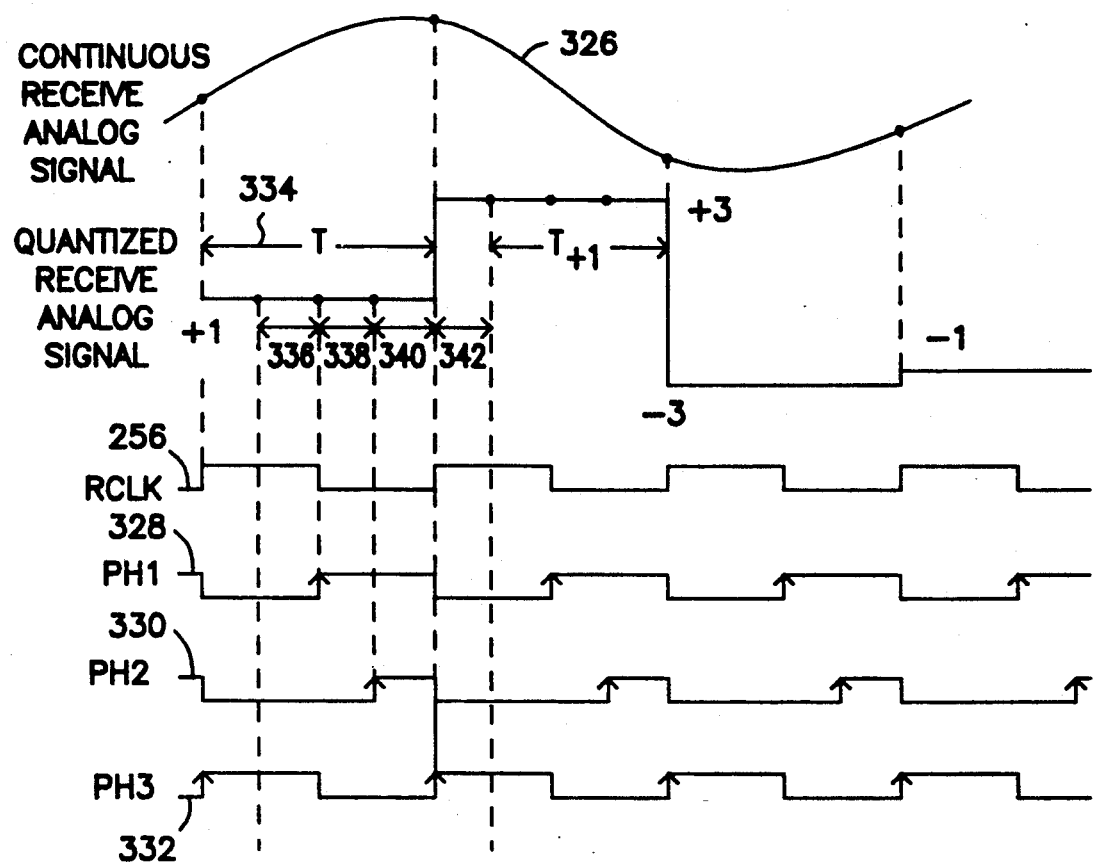
FIG. 3
FIG. 7
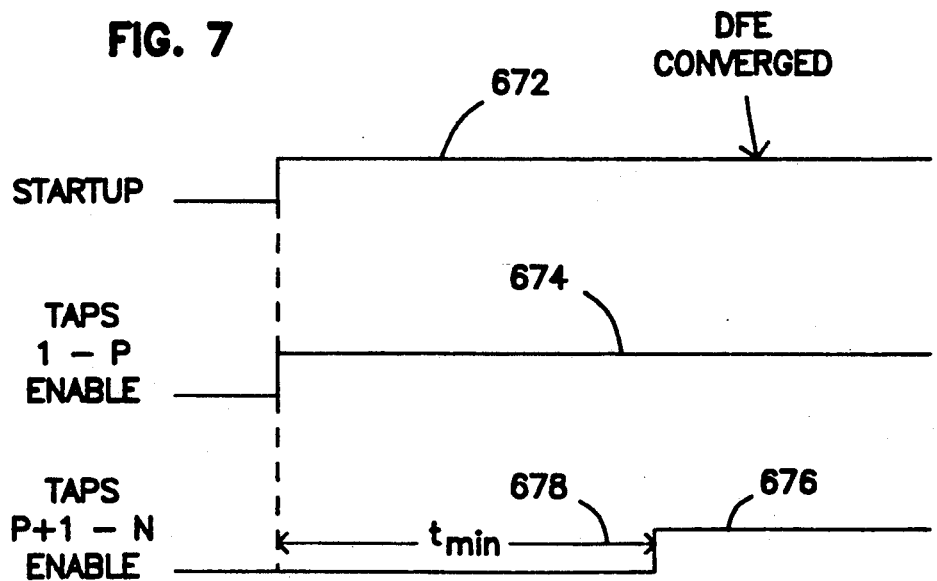

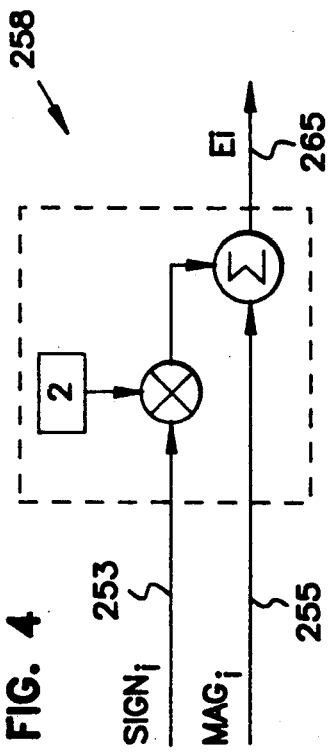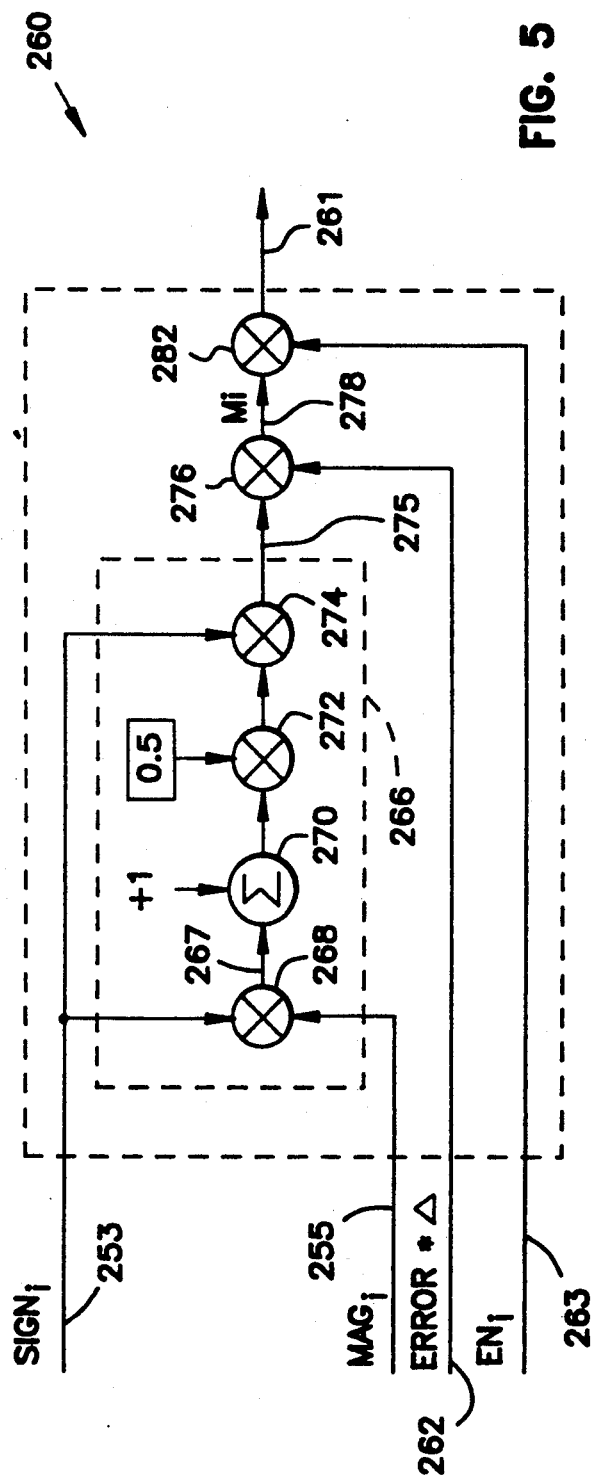

ADAPTIVE CONVERGENT DECISION FEEDBACK EQUALIZER

FIELD OF THE INVENTION

The present invention relates generally to the field of electronic filters. In particular, the present invention relates to an adaptive convergent decision feedback equalizer for reducing intersymbol interference in a bi-directional data communication system. While the present invention has numerous applications, it will be described in relation to its application for reducing intersymbol interference (ISI) in an integrated services digital network (ISDN).

BACKGROUND OF THE INVENTION

Decision feedback equalizers (DFE) are known in the art for reducing intersymbol interference (ISI) caused in digital data communication channels having narrow bandwidths such as a telephone voice communication channel. A DFE may have a multiple (N-tap) transversal type filter in which digital data is received, decoded and sequentially shifted or delayed through the N-taps at a baud rate (T). The output of the N-taps are multiplied by individual tap coefficients to produce N-products, which are summed to construct an estimated replication of the ISI present in the received signal. The ISI in the received signal is cancelled by subtracting the ISI estimate from it. In order to hone the ISI estimate so as to provide better cancellation, a .DFE may have a transversal filter with adaptive tap coefficients adapting as a function of the error between the true and estimated ISI. A signal which is a faithful reproduction of the desired signal is produced by iteratively adapting tap coefficients until an estimate closely equaling the true ISI is obtained and subtracted from the receive data signal.

U.S. Pat. No. 4,789,994 to Randell et. al. issued Dec. 6, 1988, herein incorporated by reference, teaches an adaptive DFE using a precursor error signal for convergence control. The DFE measures the ISI precursor effect in each baud signal decision output and updates all transversal filter tap coefficients in response to a multiple cursor effect estimate. A sign update algorithm is used for coefficient adaptation but stable convergence of the DFE by selective tap coefficient adaptation is not addressed. Although ISI estimation is improved as the number of filter taps in the DFE is increased, a side effect to this is to also increase the probability of the ISI estimate diverging on start up. The probability of divergence increases due to the added error contributions induced by excessive noise or interference and propagated by the additional filter taps. When the DFE first starts up, all tap coefficients of the filter are set to zero. It is at this time that the process of coefficient modification is of increased concern. If the probability of error in updating the DFE filter coefficients is greater than 0.5, the DFE ISI estimate will not converge. As adaptation proceeds, the coefficients become non-zero and received data errors caused by ISI lead to erroneous coefficient modification and hence more decoding errors leading even further to more decoding errors thus causing the DFE ISI estimation to diverge. In a DFE having a filter with a plurality of taps, such as 30 taps, divergence is inevitable unless steps are taken to prevent it.

U.S. Pat. No. 4,520,489 to Hogge issued May 25, 1985, herein incorporated by reference, provides decision feedback equalization using a variable gain differential amplifier as a level detector and a variable gain adjustment to provide non-delayed positive feedback and bit time delayed intersymbol interference compensating feedback to both enhance the amplitude of the present bit and reduce the ISI of one or more prior bits, but does not address adaptation or convergence of the DFE.

U.S. Pat. No. 4,583,234 to Ramadan issued Apr. 15, 1986, herein incorporated by reference, teaches a DFE having positive feedback to enhance the amplitude of the present data bit as well as providing negative feedback to cancel postcursor ISI. It is silent on convergent DFE coefficient adaptation.

U.S. Pat. No. 4,412,341 to Gersho et. al. issued Oct. 25, 1983, herein incorporated by reference, describes a method and apparatus for avoiding error propagation in ISI cancellation using a phase compensation filter to give receive date estimates and comparing them against uncompensated estimates.

U.S. Pat. No. 4,468,786 to Davis issued Oct. 25, 1983, herein incorporated by reference, teaches an adaptive DFE using a training sequence for stable convergence.

SUMMARY OF THE INVENTION

The aforementioned ISI estimation divergence problem with prior adaptive decision feedback equalizers is obviated in accordance with the present invention by taking two steps to reduce the probability of error propagation.

A probability density function (PDF) for ISI error is calculated by convolving a pulse response for the expected worst case communication channel such as the American National Standard Institute (ANSI) T1.601-1988 loop #3 with a pseudo-random data sequence. The probability P(ISI) of decoding an error due to ISI is obtained from the PDF by taking the integral or area under the curve for voltages greater than the slicer level. The probability of error in a communication channel having properties of a T1.601-1988 loop #3 is 0.67 given a slicer level $H_o$ for the ISDN U-interface receiver and assuming all filter coefficients are modified irrespective of the level of the data contained in the tap. The DFE will ultimately diverge unless P(ISI) is reduced to less than 0.5.

In the general case with a receiver using a line code having a number of levels (R), the probability of an updating error is always one half the expected P(ISI) if coefficient modifications are only performed on taps containing a received signal representing the maximum or minimum levels since these levels are not bounded by decision thresholds (slicer levels) above and below respectively. Alternatively stated, the ISI can exceed the slicer level in these cases without registering data errors.

Accordingly, the present invention performs a coefficient modification only when the received signal in a particular filter tap is a maximum or minimum level of the selected line code. In an ISDN U-interface having 2B1Q encoded data, coefficients are modified only on taps containing received signals representing quaternary levels +3 or −3 since no extreme bounds on the slicer level exist. The probability of error is one-half the probability when all coefficients are modified, namely, P(ISI)=0.335.

A second step to eliminate divergence addresses the coefficient determination on start up and errors in ISI estimation as the DFE coefficients grow in size. In DFEs having multiple taps, errors are not purged until they are shifted through all of the taps. The accumulation of erroneous contributions of the various taps could give an ISI estimate which exceeds the slicer level. For example, when a receive error occurs in the first tap of the DFE, the margin against error is reduced to $H_o$ less the coefficient incremental change (M). With a second error, there is a 50% chance that the margin is reduced to $H_o$ less twice the coefficient incremental change and so forth with a third error. This phenomenon is especially true on start up when all the coefficients are approximately the same magnitude, namely zero, and have not yet assimilated the characteristics of the ISI present in the received signal. To avoid this, the first (P) taps of a N-tap DFE are chosen for updating and the remaining taps (N-P) are held at zero for a time ($t_{min}$). The minimum number of taps (P) necessary is a number of taps for which the sum of the uncancelled ISI and the voltage error of an incorrect ISI estimation yields less than 0.5 probability of an error. The PDF of the residual ISI for a worst case communication channel response was calculated and simulated for values of P ranging from 1 to N over a time span from start up to final convergence. P(ISI) was extracted from the PDF for varying values of P by taking the integral or area under the curve for voltages which exceed the slicer level. A value of P was chosen as the smallest value that satisfies a P(ISI) less than 0.5.

For a better understanding of the invention, as well as other objects in further features thereof, reference is had to the following detailed description of the preferred embodiment taken in conjunction with accompanying drawings.

BRIEF DESCRIPTION OF THE DRAWINGS

Referring now to the drawings in which like reference numbers represent corresponding parts throughout:

FIG. 3 is a timing diagram illustrating the temporal relationship of a continuous receive analog signal, a quantized receive analog signal, a baud rate clock (RCLK) and sampling clocks PH1, PH2, PH3 for the extracting sign, magnitude and error information respectively;

FIG. 4 is a block diagram of an estimate processing block of an $i^{th}$ tap in a N-tap adaptive convergent decision feedback equalizer;

FIG. 5 is a block diagram of a coefficient estimate processing block of an $i^{th}$ tap in a N-tap adaptive convergent decision feedback equalizer;

FIG. 7 is a timing diagram illustrating the temporal relationship on start up between enable signals for taps one through P and enable signals for taps P+1 through N in a N-tap DFE.

DESCRIPTION OF THE PREFERRED EMBODIMENT

Figure 1:
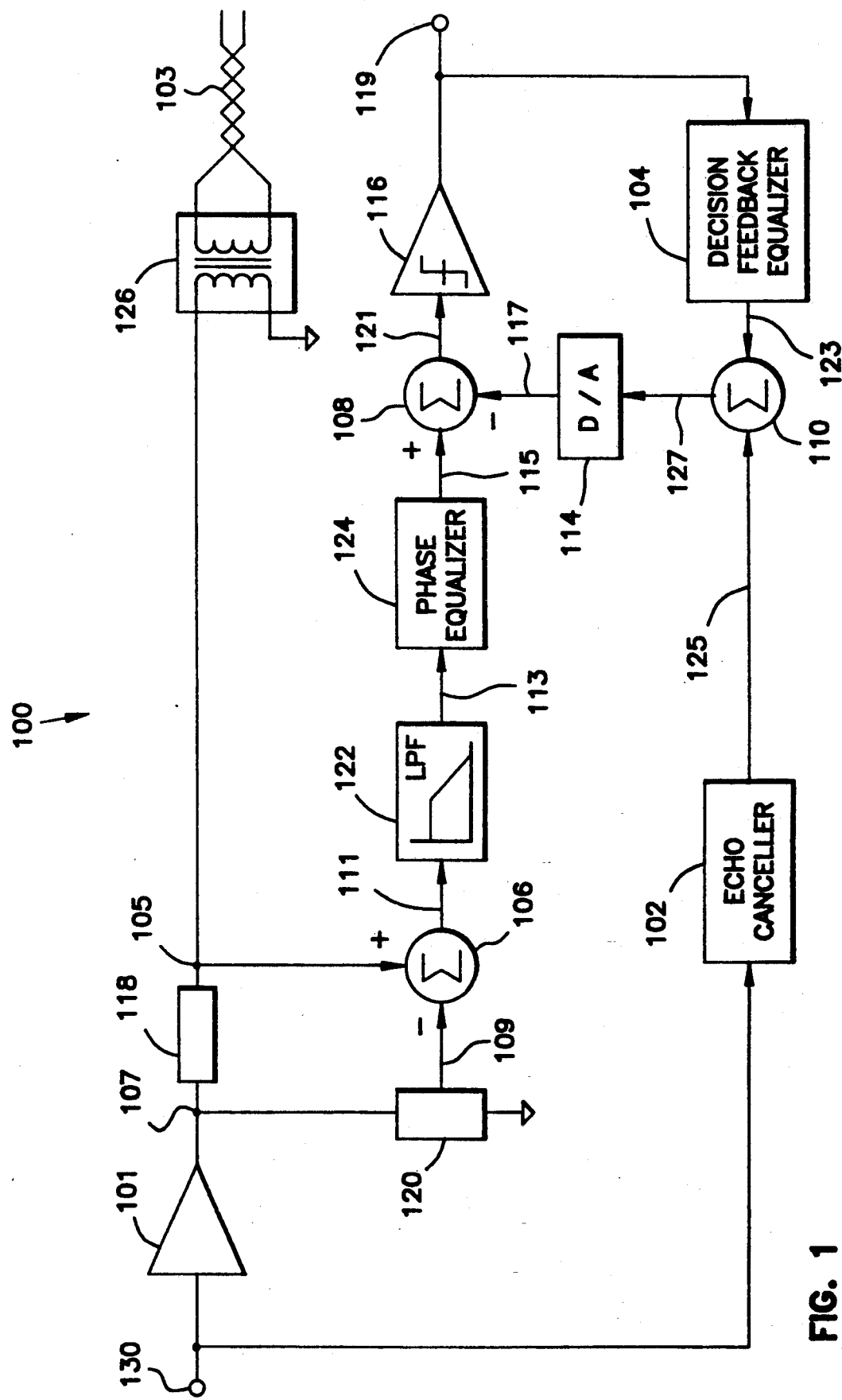
FIG. 1 is a simplified block diagram of a bi-directional data transceiver incorporating a decision feedback equalizer (DFE)

In the following description of the preferred embodiment, reference is made to the accompanying drawings which form a part hereof, and in which is shown by way of illustration a specific embodiment in which the invention may be practiced. Before describing, in detail, the particular improved adaptive convergent decision feedback equalizer according to the present invention, it should be noted that the invention resides primarily in a novel structural combination of conventional signal processing circuits, and not in the particular detailed configuration thereof. Accordingly, the structure control and arrangement of these conventional circuits have been illustrated in the drawings by readily understandable block representations, which show only those specific details that are pertinent to the present invention, in order not to obscure the disclosure with structural details which will be readily apparent to those skilled in the art having the benefit of the description herein. Thus, the block diagram illustrations in the figures do not necessarily represent the mechanical structural arrangement of the exemplary system, but are primarily intended to illustrate the major structural components in a convenient functioning grouping, whereby the present invention may be more readily understood.

Referring now to FIG. 1, a transceiver 100 in a bi-directional data communication system such as but not exclusive to, a transceiver in a integrated services digital network (ISDN) is illustrated in simplified block diagram form comprising a line driver 101 for driving a digital subscriber loop, an echo canceler 102 for cancelling residual echo, a first summing means 106, a second summing means 108, a third summing means 110, a digital to analog converter 114, a comparator 116, a first impedance network 118, a second impedance network 120, low pass filter means 122, a phase equalizer 124 for reducing precursor intersymbol interference, a decision feedback equalizer 104 for reducing intersymbol interference and a transformer 126 for isolating and coupling the transceiver 100 to a twisted pair cable 103. Data transmission occurs by applying a transmit signal to node 130 of the line driver 101. The output node 107 of line driver 101 is coupled to second impedance network 120 and to the transformer 126 through a first impedance network 118. Transformer 126 electrically isolates and couples node 105 to the twisted pair cable 103.

Data reception occurs by receiving a baseband, pulse amplitude modulated, line coded signal having a number of levels (R) impressed from a remote location onto the twisted pair cable 103. The receive signal impressed on twisted pair cable 103 is isolated and coupled to node 105 through transformer 126. Node 105 comprises an electrical junction between a first end of first impedance network 118, a first input of first summing means 106 and a first terminal from the primary side of transformer 126. A second terminal from primary side of transformer 126 is referenced to a common voltage reference. First impedance network 118 is selected to have an impedance value close to a line impedance reflected back by transformer 126. Assuming first impedance network 118 is substantially equal to the reflected line impedance, the voltage at node 105 is substantially one-half the voltage at line driver node 107 when no signals are impressed on twisted-pair cable 103. Second impedance network 120 divides down the signal at line driver node 107 providing a signal at node 109 which is one-half that at node 107. Node 109 is coupled to a second input of first summing means 106. First summing means 106 combines the signals from node 105 and node 109 in a subtractive relation and outputs a difference signal that is substantially free from transmit signal information at node 111. In the ideal case when first impedance network 118 exactly equals the reflected impedance from transformer 126, output node 111 of first summing means 106 represents only the received signal component of the signal at node 105. Node 111 is coupled to low pass filter 122 which provides an output at node 113 substantially free of high frequency components. The output node 113 is coupled to phase equalizer 124 for reducing precursor intersymbol interference. Phase equalizer output node 115 is coupled to a first input of second summing means 108. A second input to second summing means 108 is coupled to a digital to analog (D/A) converter 114 output node 117. The second summing means 108 output node 121 is coupled to comparator 116 which quantizes the analog signal at node 121 into a digital signal suitable for digital processing at node 119. Node 119 is also coupled to a decision feedback equalizer 104 for intersymbol interference reduction. The output node 123 of the decision feedback equalizer 104 is digitally combined with the output node 125 of echo canceler 102 in third summing means 110. The digital output node 127 of third summing means 110 is coupled to D/A converter 114 for conversion to an analog signal at node 117. Input node 130 is also coupled to echo canceler 102. Echo canceler 102 is not essential to the understanding of the present invention but is described in the co-pending and commonly assigned U.S. patent and application: U.S. Pat. No. 5,084,866, issued Jan. 28, 1992 by Kenneth G. Buttle entitled "TRANSVERSAL FILTER ECHO CANCELLER", and 07/507,595, filed Apr. 10, 1990, by Kenneth G. Buttle, et. al., entitled "NON-LINEAR ECHO CANCELLER", both of which applications are herein incorporated by reference. The adaptive convergent decision feedback equalizer 104 for cancelling intersymbol interference in a received signal in the data communication system comprises: transversal filter means, having a plurality (N) of taps, for generating an estimate of intersymbol interference contained in the received signal, each of the taps having an independently adaptive tap coefficient; startup means, coupled to the transversal filter means, for enabling a number (P) of the taps and for enabling a remaining number (N-P) of the taps a time $t_{min}$ after the number (P) of the taps are enabled, wherein the time $t_{min}$ is a minimum time and the number P is a minimum number of the taps that allows the transversal filter means to generate the estimate of said intersymbol interference without diverging; and detection and adaptation means, coupled to the transversal filter means, for detecting when a tap contains a received signal representing a maximum or minimum level of the selected line code and for independently adapting the tap coefficient in response thereto.

Figure 2:
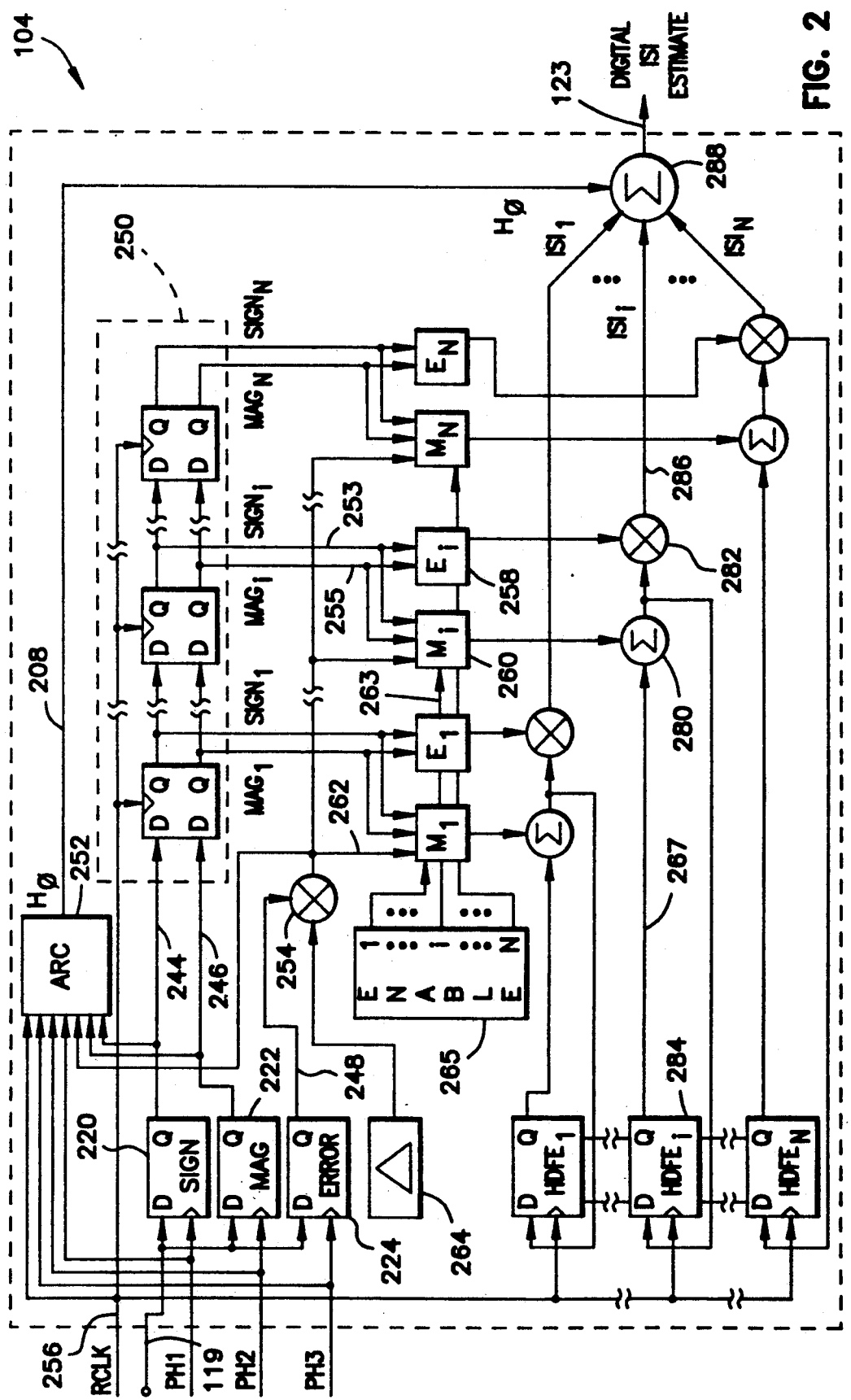
FIG. 2. is a block diagram of a N-tap adaptive convergent decision feedback equalizer.

Referring now to the DFE 104 and more particularly to FIG. 2, a detailed block diagram of an adaptive convergent DFE is illustrated. Binary data at node 119 is routed to D type flip/flops 220, 222, and 224 which at discrete intervals of time, sample and latch sign, magnitude and error information respectively. FIG. 3 illustrates the temporal relationship between a continuous analog data signal 326 located at node 121 of the transceiver 100 and clock signals PH1 328, PH2 330, and PH3 332, which clock sign, magnitude and error information flip/flops 220, 222, and 224 respectively. The baud period (T) 334 of a receive data symbol is sliced into four discreet time periods. At the end of first time slice 336, rising edge of clock signal PH1 328 clocks flip/flop 220 at the center of the baud period T latching quantized sign information. At the end of second time slice 338, rising edge of clock signal PH2 330 clocks flip/flop 222 at three-fourths of the baud period T latching quantized magnitude information. At the end of third time slice 340, rising edge of clock signal PH3 332 clocks flip/flop 224 coincident with the end of the baud period T latching quantized error information. Fourth time slice 342 is transparent allowing the received signal to flow through for use in a subsequent baud period 335 ($T_{+1}$). In the preferred embodiment, the levels of sign, magnitude and error information are represented by either a logical $+1$ or $-1$. It can be appreciated by those skilled in the art that the logic levels $+1$ and $-1$ are not exclusive and that the logic levels can be extended to any range with the appropriate scaling.

Referring again to FIG. 2, node 244 containing latched sign information and node 246 containing latched magnitude information are routed to a transversal filter comprising an array of delay elements 250 in cascade for keeping a pipeline or history cache of previous baud sign and magnitude levels and to an automatic reference control means (ARC) 252 which compensates for slicer level threshold variations. The automatic reference control means (ARC) 252 compensates for slicer level variations in the received signal by generating a reference signal which is summed with the estimate of the intersymbol interference.

Figure 6:
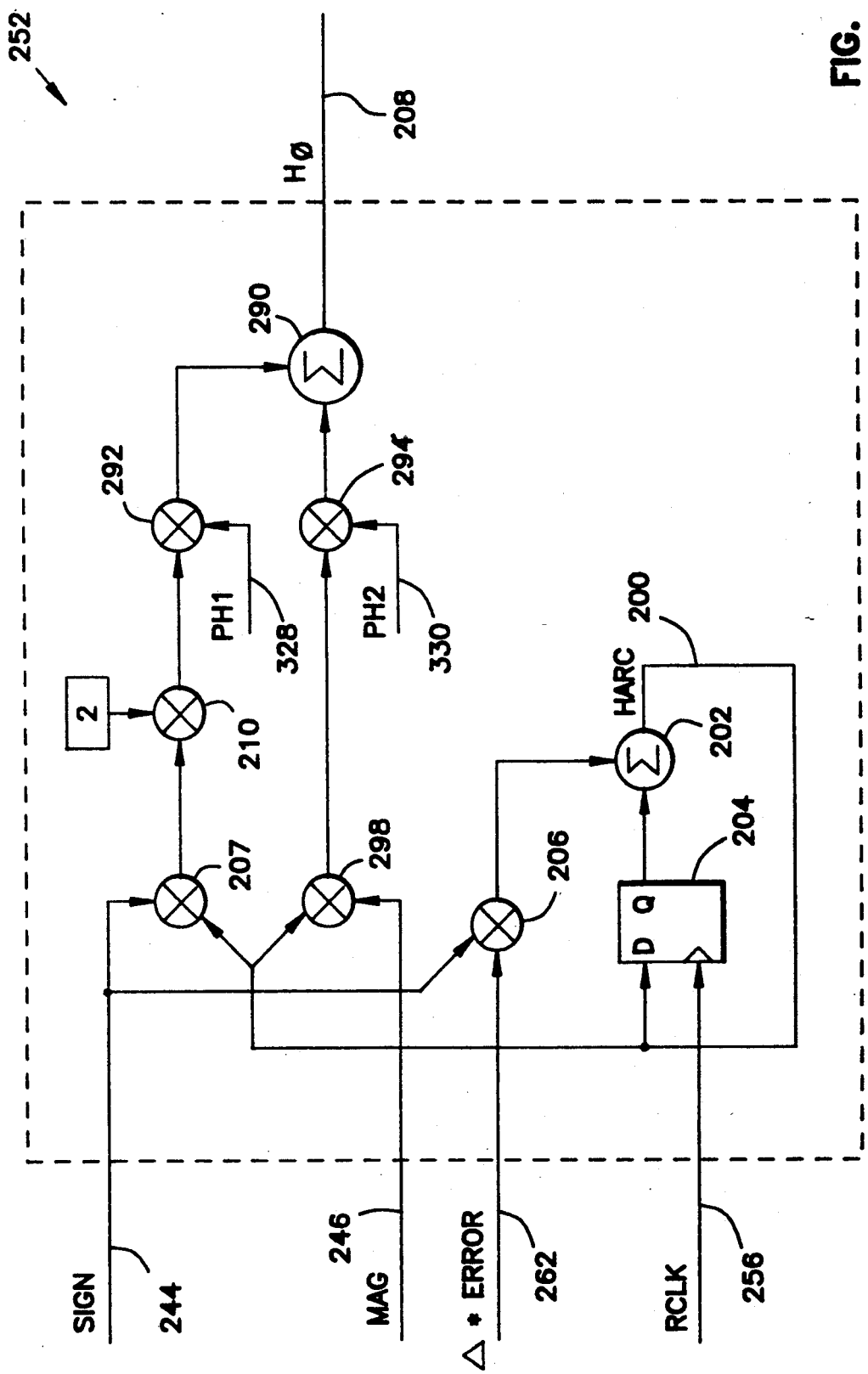
FIG. 6 is a block diagram of an automatic reference control means (ARC) for compensating for slicer level threshold variations.

Referring now to FIG. 6, a block diagram of the ARC 252 is shown. A slicer level reference signal or coefficient ($H_o$) 208 is generated to compensate for slicer level threshold variation by digital summing means 290 which sums the products of digital multipliers 292 and 294. The product of multiplier 294 is between clock signal PH2 330 and a product of digital multiplier 298. Multiplier 298 multiplies magnitude information from node 246 and an ARC coefficient (HARC) 200. HARC 200 is generated by summing means 202 which sums the HARC signal from a previous baud period ($T_{-1}$) stored in flip/flop 204 with the product of multiplier 206. Multiplier 206 multiplies the product of modification step $\Delta$ and error information from node 262 with sign information from node 244. The output of summing means 202 (HARC 200) is routed to multipliers 298 and 207 and back to flip/flop 204 which is clocked by baud rate clock RCLK 256. Flip/flop 204 output provides HARC 200 for the next baud iteration. The output of multiplier 292 is a product of clock signal PH1 328 and multiplier 210 output. Multiplier 210 multiplies by a factor of two, the output of multiplier 207 which is the product of HARC 200 and sign information from node 244.

Referring again to FIG. 2, error information from node 248 is routed to a digital multiplier 254 for multiplication with the output of modification step $\Delta$ generator 264 to form a product at node 262. Sign and magnitude information from flips/flops 220 and 222 is sequentially shifted through delay element array 250 by a receive baud rate clock (RCLK) 256, such as a 80 kHz clock signal for 2B1Q encoded data in an ISDN. Each element of the delay element array 250 represents a tap from which progressively older sign and magnitude information is obtained for use in generating an ISI estimate. Sign and magnitude information stored in the taps of delay element array 250 is routed to an estimate processing block and to a coefficient processing block of the respective tap.

An estimate processing block 258 for an $i^{th}$ tap is illustrated in FIG. 4 and is illustrative of all estimate processing blocks in DFE 104. Estimate processing block 258 for an $i^{th}$ tap multiplies by a factor of two, sign information ($sign_i$), which in the preferred embodiment is either a logical +1 or −1, and sums the associated magnitude information ($mag_i$) which in the preferred embodiment is also a logical +1 or −1, producing an output estimate ($E_i$). It can be appreciated by those skilled in the art that the numerical scaling in the estimate processing block could be modified to accommodate logic levels other than +1 an −1.

A coefficient processing block 260 for producing an incremental change ($M_i$) in a tap coefficient ($HDFE_i$) of an $i^{th}$ tap is illustrated in FIG. 5 and is illustrative of all coefficient processing blocks in DFE 104. In addition to $sign_i$ and $mag_i$ information inputs, coefficient processing block 260 has a third input connected to the output of multiplier 254. The output of multiplier 254 (node 262) is a product of error information at node 248 and an incremental modification step ($\Delta$). The incremental modification step size ($\Delta$) is a constant value generated by a modification step size generator 264. By experimentation on actual telephone lines and software simulations of worst case line conditions, the largest step size ($\Delta$) which assures convergence of the DFE and yet sufficiently reduces ISI was found to be a value $2^{-4}$ times the step size of D/A converter 114.

Referring again to FIG. 5, inhibit logic 266 of $i^{th}$ tap coefficient processing block 260 receives sign information 253 ($sign_i$) and multiplies it in digital multiplier 268 by corresponding magnitude information 255 ($mag_i$) to form a product at node 267. Node 267 is summed with a logical +1 in digital summing means 270. Output of summing means 270 is multiplied by a factor of 0.5 in digital multiplier 272 to form a product. The product of digital multiplier 272 is multiplied by sign information 253 ($sign_i$) in digital multiplier 274 to form a product. The product of digital multiplier 274 is a logical +1 for received signals representing a maximum or minimum level of the selected line code and zero for all others. The product of digital multiplier 274 is multiplied in digital multiplier 276 by of node 262 of error and step size ($\Delta$) producing an incremental change ($M_i$) at node 278. Inhibit logic 266 produces a zero sum at node 275 so as to inhibit incremental change ($M_i$) at node 278 in the $i^{th}$ tap when a received signal in an $i^{th}$ tap represents a level other than a maximum or minimum level of the selected line code. If the received signal is not a maximum or minimum level, tap coefficient incremental change ($M_i$) at node 278 is zero. It can be appreciated by those skilled in the art that the numerical scaling in coefficient processing block 260 could be modified to accommodate logic levels other than +1 an −1.

Still referring to FIG. 5, coefficient processing block 260 further comprises means for disabling the incremental change ($M_i$) at node 278 when the enable signal is dis-asserted. Incremental change ($M_i$) at node 278 is multiplied by an enable signal 263 (ENi) in digital multiplier 282 producing a zero product when enable signal 263 is dis-asserted.

Referring again to FIG. 2, incremental change ($M_i$) from coefficient processing block 260 is summed in digital summing means 280 with tap coefficient $HDFE_i$ from node 267. The effect of summing $M_i$ with tap coefficient $HDFE_i$ is mathematically represented as:

$$HDFE_i(T_{+1}) = HDFE_i(T) + M_i$$

wherein T is the baud period and $T_{+1}$ is the subsequent baud period to T.

Summing means 280 output is routed to a digital multiplier 282 and back to the input of D type flip/flop 284. Flip/flop 284 is a means for retaining the level of $HDFE_i$ for the next baud iteration. The rising edge of baud rate clock signal RCLK 256 causes the output of digital summing means 280 to be latched in flip/flop 284 providing coefficient $HDFE_i$ for the next baud iteration. Digital summing means 280 output is multiplied with estimate level ($E_i$) from estimate processing block 258 in multiplier 282 to produce an ISI estimate element ($ISI_i$) at node 286. ISI estimate elements of taps 1 through N are summed in digital summing means 288 along with the output $H_o$ 208 of ARC 252. The estimate ($ISI_{est}$) of the intersymbol interference is mathematically represented as:

$$ISI_{est} = \sum_{i=1}^{N} ISI_i + H_0$$

wherein N is the number of taps.

On start up, enable logic 265 enables a minimum number of taps (P) and for a minimum time ($t_{min}$), withholds enabling the remaining number of taps (N-P). The time $t_{min}$ is a minimum time and P is a minimum number of taps that allows the filter to roughly approximate the ISI present without diverging. The minimum number of DFE taps (P) and the minimum time ($t_{min}$) on start up for stable and quick convergence was determined by software simulation and experimentation on telephone lines exhibiting ANSI T1.601-1988 test loop #3 characteristics.

FIG. 7 illustrates the temporal relationship between start up signal 672, taps one through P enable signals 674 and taps P+1 through N enable signals 676. The minimum time ($t_{min}$) 678 before enabling taps P+1 through N is a minimum time at which under worst case line conditions (ANSI T1.601-1988 test loop #3), the peak residual ISI is less than one-half the slicer level ($H_o$).

The detailed description of the preferred embodiment of the invention having been set forth herein for the purpose of explaining the principles thereof, it is known that there may be modifications, variation or change in the invention without departing from the proper scope of the invention and the claims thereto.

What is claimed is:

1. An adaptive convergent decision feedback equalizer in a data communication system for cancelling intersymbol interference in a received signal, comprising:
   (a) transversal filter means, having a plurality N of taps, for generating an estimate of said intersymbol interference contained in said received signal, each of said taps providing an output in a form of sign and magnitude information;
   (b) startup means, coupled to said transversal filter means, for enabling a number P of said taps and for enabling a remaining number N-P of said taps a time $T_{min}$ after said number P of said taps are enabled, wherein said time $T_{min}$ is a minimum time and said number P is a minimum number of said taps that allows said transversal filter means to generate said estimate of said intersymbol interference without diverging; and (c) estimate and coefficient processing means, coupled to said tap outputs and responsive to said sign and magnitude information contained therein, for independently processing information in each of said tap outputs, said estimate and coefficient processing means providing a zero output from an individual tap when said tap contains information other than a maximum and minimum level of said received signal.

2. The adaptive convergent decision feedback equalizer in accordance with claim 1, further comprising automatic reference control means for generating a reference signal for summing with said estimate of said intersymbol interference to compensate for slicer level variations in said received signal.

3. The adaptive convergent decision feedback equalizer in accordance with claim 1, wherein said estimate and coefficient processing means comprises:
   (1) means, coupled to said taps outputs and individually controllable for each tap, for producing an incremental change M in selective tap outputs; and
   (2) means, coupled to said startup means and responsive thereto, for disabling said incremental change M in selective tap outputs.

4. The adaptive convergent decision feedback equalizer in accordance with claim 1, wherein said received signal is a baseband line coded signal having a number of levels R.

5. An adaptive convergent decision feedback equalizer for cancelling intersymbol interference in a pulse amplitude modulated data communication system, comprising:
   (a) sampling means, synchronous to a system clock having a baud period, for extracting sign, magnitude and error information from a received signal at discrete intervals of time within said baud period;
   (b) delay line means coupled to said sampling means and having a plurality of tap outputs, for providing a history cache of said sign and magnitude information from previous baud periods;
   (c) means, coupled to said tap outputs, for modifying a select tap output when information corresponding therein, contains a maximum and minimum level of said received signal, said tap output modified by adding thereto a product of said error information and a modification step size $\Delta$; and
   (d) means, coupled to said delay means and said means for modifying, for multiplying said sign and magnitude information stored in said tap by said tap output.

6. An adaptive convergent decision feedback equalizer in accordance with claim 5, further comprising means, responsive to said sampling means, for compensating variations in slicer level thresholds in said received signal.

7. An adaptive convergent decision feedback equalizer in accordance with claim 5, wherein said pulse amplitude modulated data communication system comprises an integrated services digital network.

8. An adaptive convergent decision feedback equalizer in accordance with claim 5, wherein said maximum level of said received signal is represented by a positive three.

9. An adaptive convergent decision feedback equalizer in accordance with claim 5, wherein said minimum level of said received signal is represented by a negative three.

10. An adaptive convergent decision feedback equalizer circuit for reducing intersymbol interference in a received signal, comprising:
    (a) a plurality N of taps;
    (b) means, coupled to said taps, for calculating a tap coefficient ($HDFE_i$) for an ith tap of said N taps so that:

$$HDFE_i(T_{+1}) = HDFE_i(T) + M_i$$

wherein T is a baud period, $T_{+1}$ is a subsequent baud period to T and $M_i$ is an incremental change; and
    (c) means for generating an estimate ($ISI_{est}$) of said intersymbol interference so that:

$$ISI_{est} = \sum_{i=1}^{N} ISI_i + H_0$$

wherein $H_o$ is a compensating reference signal for slicer level threshold variation.

11. A method for cancelling intersymbol interference on a received signal in a data communication system, comprising the steps of:
    (a) caching said received signal in a N-tap transversal filter and generating an intersymbol interference estimate therefrom;
    (b) processing a tap coefficient output HDFE for a tap in said N-tap transversal filter in which said tap represents a maximum level;
    (c) processing a tap coefficient output HDFE for a tap in said N-tap transversal filter in which said tap represents a minimum level; and
    (d) enabling a number P of said taps at a startup time and then enabling a remaining number N–P of said taps at a time $t_{min}$ after said startup time, wherein said time $t_{min}$ is a minimum time and said number P is a minimum number of said taps that allows said transversal filter to generate said estimate of said intersymbol interference without diverging.

12. The method of claim 11, further comprising the step of compensating for slicer level variations in said received signal.

13. The method of claim 11, wherein said received signal is a baseband line coded signal having a number of levels R.

14. The method of claim 11, wherein the processing step (b) further comprises the steps of:
    (1) producing an incremental change M in said tap coefficient HDFE for which said tap output represents a maximum level; and
    (2) disabling said incremental change in said tap output when said tap is not enabled.

15. The method of claim 11, wherein the processing step (c) further comprises the steps of:
    (1) producing an incremental change M in said tap coefficient HDFE for which said tap output represents a minimum level; and
    (2) disabling said incremental change in said tap output when said tap is not enabled.

16. A method in accordance with claim 11, further comprising compensating for variations in slicer level thresholds in said received signal.

17. A method of cancelling intersymbol interference in a pulse amplitude modulated data communication system, comprising of the steps of:

(a) extracting sign, magnitude and error information from a received signal at discrete intervals of time within a baud period (T);
(b) caching said sign and magnitude information from previous baud periods in at least one tap;
(c) modifying a tap output when said tap contains a maximum and minimum level of said received signal, said tap output modified by adding thereto a product of said error information and a modification step size ($\Delta$); and
(d) multiplying said sign and magnitude information stored in said tap by said tap output.

18. A method of preventing an adaptive decision feedback equalizer having an N-tap transversal filter from diverging, comprising the steps of:
(a) updating a tap output when said output contains a signal representing a maximum or minimum level;
(b) enabling a minimum number (P) of said N taps on startup when a sum of uncancelled intersymbol interference in said signal and a voltage error of an incorrect intersymbol interference estimation in said signal yields less than 0.5 probability of an error; and
(c) enabling a remaining (N−P) number of said N taps at a time ($t_{min}$) for which convergence occurs after enabling said minimum number P of taps.

19. A method of reducing intersymbol interference in a received signal using an adaptive convergent decision feedback equalizer circuit comprising a plurality N of taps, the method comprising:
(a) calculating a tap coefficient ($HDFE_i$) for an ith tap of said N taps so that:

$$HDFE_i(T_{+1}) = HDFE_i(T) + M_i$$

wherein T is a baud period, $T_{+1}$ is a subsequent baud period to T and $M_i$ is an incremental change; and
(b) generating an estimate ($ISI_{est}$) of said intersymbol interference so that:

$$ISI_{est} = \sum_{i=1}^{N} ISI_i + H_0$$

wherein $H_o$ is a compensating reference signal for slicer level threshold variation.

* * * * *

UNITED STATES PATENT AND TRADEMARK OFFICE
CERTIFICATE OF CORRECTION

PATENT NO.   : 5,157,690
DATED        : October 20, 1992
INVENTOR(S)  : Kenneth G. Buttle It is certified that error appears in the above-identified patent and that said Letters Patent is hereby corrected as shown below:

In the Abstract, line 7, before "estimation", "the" should read --The--. Column 5, line 67, "discreet" should read --discrete--. Column 10, line 19, "'=1" should read --i=1--.

Signed and Sealed this

Fifth Day of October, 1993

Attest:

BRUCE LEHMAN

*Attesting Officer*    Commissioner of Patents and Trademarks